United States Patent [19]

Hoehn

[11] 4,092,552
[45] May 30, 1978

[54] BIPOLAR MONOLITHIC INTEGRATED PUSH-PULL POWER STAGE FOR DIGITAL SIGNALS

[75] Inventor: Wolfgang Hoehn, Keltenring, Germany

[73] Assignee: ITT Industries, Incorporated, New York, N.Y.

[21] Appl. No.: 799,416

[22] Filed: May 23, 1977

[51] Int. Cl.² .......................................... H03K 17/60
[52] U.S. Cl. ............................... 307/299 A; 307/213; 307/254; 330/273; 330/307
[58] Field of Search ....................... 330/262, 273, 307; 307/299 A, 254, 213

[56] References Cited

U.S. PATENT DOCUMENTS 4,049,975  9/1977  Colaco .............................. 307/299 A Primary Examiner—James B. Mullins
Attorney, Agent, or Firm—John T. O'Halloran; Peter C. Van Der Sluys

[57] ABSTRACT

The push-pull stage contains a special double emitter transistor which prevents current spikes during switch-over transition. One of two emitters is connected to the base of the double emitter transistor. The junction area of this emitter is many times greater than that of the other emitter.

5 Claims, 2 Drawing Figures

BIPOLAR MONOLITHIC INTEGRATED PUSH-PULL POWER STAGE FOR DIGITAL SIGNALS

BACKGROUND OF THE INVENTION

The present invention relates to the improvement of conventional bipolar monolithic integrated push-pull power output stages for digital signals, as customarily used, for instance, in so-called TTL-circuits (cf. the technical journal "L'Onde Electrique", May 1968, pp. 443 to 448, especially FIG. 3 on page 444).

In conventional types of push-pull output stages, current spikes are produced during switching of the two transistors. For some applications such as when the output or power stages of frequency dividers are used in electronic organs, the current spikes must be avoided because such electronic organs include voluminous supply-voltage and control-lead wiring and the current spikes of the supply voltage would cause severe disturbances in the controlled parts.

SUMMARY OF THE INVENTION

It is an object of the present invention to provide a push-pull power output stage having a low output impedance so that low-ohmic load resistors may be coupled.

It is a further object of the invention that the saturation voltage be as low as possible with respect to the zero point of the circuit so that further logic circuits to be operated at the output can be controlled either directly or across a series resistor.

It is a further object of the invention that the swithing behavior of the two transistors of the push-pull output stage produce no current spikes which, in equipment employing integrated circuits may lead to noise pulses affecting other circuit parts over the supply voltage leads.

Finally, it is an object of the invention that the push-pull output stage require a minimum of crystal surface.

According to a broad aspect of the invention, there is provided a bipolar monolithic integrated push-pull power output stage for digital signals, comprising: a first transistor having a base, emitter and collector, said collector for receiving a source of supply voltage; a second transistor having a base, emitter and collector, said emitter for coupling to the zero point of the circuit and said base forming an input; a double emitter transistor having first and second emitters, a base and a collector, said collector coupled to the emitter of said first transistor and forming an output, said first emitter coupled to the collector of said second transistor and to the base of said first transistor, and said second emitter coupled to the base of said double emitter transistor, the emitter base junction area of said second emitter being at least two times greater than that of said first emitter; and means for applying a potential to the base of said first transistor and to the base of said double emitter transistor.

The above and other objects of the present invention will be more clearly understood from the following detailed description taken in conjunction with the accompanying drawings, in which:

DESCRIPTION OF THE PREFERRED EMBODIMENT

Figure 1:
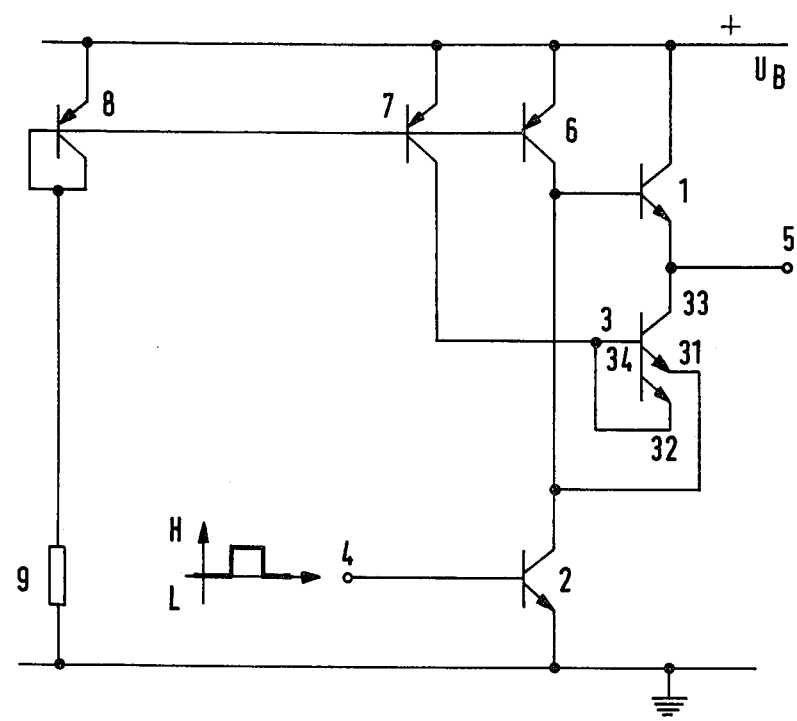
FIG. 1 shows the circuit diagram of one embodiment of the invention.

In the circuit diagram shown in FIG. 1, the push-pull power output stage consists of a first transistor 1 whose collector is applied to the + voltage-conducting pole of the source of supply voltage $U_B$, and of a second transistor 2 whose emitter is applied to the zero point of the circuit and whose base serves as the input 4 for a digital signal. The emitter of the first transistor 1 is connected to the collector 33 of a double emitter transistor 3 which also represents the output 5 of the power output stage. The first emitter 31 of the double emitter transistor 3 is connected to the collector of the second transistor 2 and to the base of the first transistor 1. The second emitter 32 of the double emitter transistor 3 is connected directly to the base 34 thereof. The first transistor 1, the second transistor 2 and the double emitter transistor 3 are all of the same conductivity type, hence npn-transistors in the example of embodiment shown in FIG. 1.

The base of the first transistor 1, the collector of the second transistor 2, and the first emitter 31 of the double emitter transistor 3 are applied via the collector-emitter path of a constant current source transistor 6 serving as a resistor substitute to the + voltage-conducting pole of the source of supply voltage $U_B$ to which there is likewise applied the base 34 and the second emitter 32 of the double emitter transistor 3 via the collector-emitter path of the constant current source transistor 7 likewise serving as a resistor substitute. The two constant current source transistors 6, 7 together with a transistor 8 whose collector is connected to its base and to the base electrodes of the constant current source transistors 6, 7, and whose emitter is applied to the + voltage-conducting pole of the source of supply voltage $U_B$, and with the resistor 9 connecting the base and the collector of the constant current source transistor 8 to the zero point of the circuit, form a multiple constant current source of transistors which are complementary to the output stage transistors 1, 2, 3, hence in the example of embodiment shown in FIG. 1, of pnp-transistors.

The emitter-base-pn-junction area of the second emitter 32 of the double emitter transistor 3, according to the invention, is at least twice, but preferably four to five times greater than that of the first transistor 31.

Figure 2:
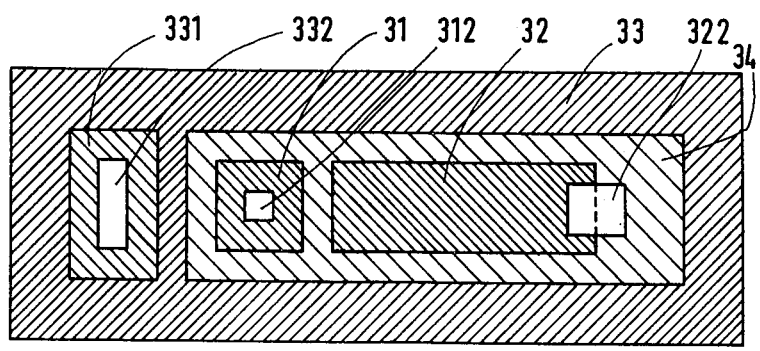
FIG. 2 schematically shows the ground plan view of the double emitter transmitter as used in the invention.

This dimensioning of the area which is essential to the invention, is schematically shown in FIG. 2. The area hatchlined towards the right hand upper corner, represents the collector region 33 of the double emitter transistor 3. The widely spaced hatchlined area extending to the left hand upper corner represents the base region 34 thereof. The narrow hatchlined areas extending towards the left hand upper corner represent the regions produced by way of emitter diffusion. The corresponding area lying directly within the collector region 33 is the contacting region 331 thereof which is provided with a corresponding contact metallization 332.

The square region lying within the base region 34 represents the first emitter region 31 which is provided with a corresponding contact metallization 312, and the rectangular region lying on the right next to the first emitter region 31 represents the second emitter region 32 which, via the contact metallization 322 is in a conductive connection with the base region 34. This contact metallization 322 corresponds to the conductive connection between the base 34 and the second emitter 32 in FIG. 1. As may be taken from FIG. 2, the emitter-base-pn-junction area of the second emitter 32 is at least twice, namely three times greater than that of the first emitter 31.

The push-pull power output stage according to the invention operates as follows:

If the digital signal as applied to the input 4 is in the state L corresponding to the lower potential, both the base of the first transistor 1 and the base 34 of the double emitter transistor 3 are supplied with base current via the collectors of the constant current source transistors 6 or 7, because the second transistor 2 is blocked. Accordingly, via the collector-emitter path of the first transistor 1, an output current is permitted to flow into a load resistor connected to the output 5, which may extend from the output 5 to any arbitrary potential. In this circuit state, the base-emitter path of the first transistor 1 must be prevented from being short-circuited by the partial transistor 31, 33, 34 of the double emitter transistor 3, which is inversely operated in this case. This is accomplished in that the inverse current gain of the partial transistor 31, 33, 34 which normally, hence without the second emitter 32 designed in accordance with the invention, is in the order of unity (1), is strongly reduced in that the emitter-base-pn-junction area of the second emitter 32 is enlarged with respect to that of the first emitter 31, and connected to the base 34.

In the case of a four times larger emitter-base-pn-junction area there will result at first a reduction of the inverse current gain to about 0.25. In addition thereto, however, by the thus required enlargement of the entire base-collector-pn-junction area of the double emitter transistor 3, this is still further reduced, so that there will result an actual reduction to about 0.1, i.e. 90% of the current supplied by the collector of the constant current source transistor 6 will be utilized as the base current of the first transistor 1.

If the digital signal at the input 4 changes from its state L into the state H corresponding to a high potential and, consequently, also the signal at the output 5 changes into the corresponding state L, then the second transistor 2 is driven into saturation, so that the double emitter transistor 3 returns from inverse operation as existing in the state L of the digital signal, to normal operation. On account of this, however, the first transistor 1 becomes blocked, and the load current will flow via the series connection consisting of the collector-emitter path of the partial transistor 31, 33, 34 of the double emitter transistor 3 and of the collector-emitter path of the second transistor 2. By the aforementioned blocking of the first transistor 1 during this operating state, the push-pull power output stage, however, is reliably protected from the transistors 1 and 2 becoming simultaneously conductive during the transitional phase while changing from the state H to the state L and vice versa, so that there will not appear the aforementioned current spikes.

Moreover, from the double emitter transistor 3 as the component arranged between the transistors 1 and 2, there will still result the desired low output resistance of about 200 ohms. The crystal surface area as required by the power output stage, moreover, is sufficiently small, so that several such power output stages can be used in one single integrated circuit, such as in integrated frequency dividers for electronic organs. Of course, the push-pull power output stage according to the invention can also be used for the output power amplification of low-frequency signals of the type as appearing, e.g. in audio amplifiers.

What is claimed is:

1. A bipolor monolithic integrated push-pull power output stage for digital signals, comprising:
    a first transistor having a base, emitter and collector, said collector for receiving a source of supply voltage;
    a second transistor having a base, emitter and collector, said emitter for coupling to the zero point of the circuit and said base forming an input;
    a double emitter transistor having first and second emitters, a base and a collector, said collector coupled to the emitter of said first transistor and forming an output, said first emitter coupled to the collector of said second transistor and to the base of said first transistor, and said second emitter coupled to the base of said double emitter transistor, the emitter base junction area of said second emitter being at least two times greater than that of said first emitter; and
    means for applying a potential to the base of said first transistor and to the base of said double emitter transistor.

2. A bipolar monolithic integrated push-pull power output stage according to claim 1 wherein said first and second transistors and said double emitter transistor are of the same conductivity type.

3. A bipolar monolithic integrated push-pull power output stage according to claim 2 wherein said means comprises a resistor.

4. A bipolar monolithic integrated push-pull power output stage according to claim 2 wherein said means comprises a source of constant current.

5. A bipolar monolithic integrated push-pull power output stage according to claim 2 wherein the emitter base junction area of said second emitter is three times greater than that of said first emitter.

* * * * *

UNITED STATES PATENT AND TRADEMARK OFFICE
CERTIFICATE OF CORRECTION

PATENT NO. : 4,092,552
DATED : May 30, 1978
INVENTOR(S) : Wolfgang Hoehn

It is certified that error appears in the above-identified patent and that said Letters Patent are hereby corrected as shown below:

[30] Add--Foreign Application Priority Data

June 18, 1976   Germany ----   26 27 339

*Signed and Sealed this*

*Twenty-seventh* Day of *February 1979*

[SEAL]

Attest:

RUTH C. MASON
*Attesting Officer*

DONALD W. BANNER
*Commissioner of Patents and Trademarks*